United States Patent [19]

Oberhauser

[11] Patent Number: 5,321,313
[45] Date of Patent: Jun. 14, 1994

[54] CONTROLLED POWER MOSFET SWITCH-OFF CIRCUIT

[75] Inventor: Johann Oberhauser, Freising-Hohenbachern, Fed. Rep. of Germany

[73] Assignee: Texas Instruments Incorporated, Dallas, Tex.

[21] Appl. No.: 1,475

[22] Filed: Jan. 7, 1993

[51] Int. Cl.⁵ .................. H03K 17/28; H03K 17/56
[52] U.S. Cl. .................. 307/242; 307/570; 307/560; 307/246
[58] Field of Search .......... 307/242, 315, 544, 548, 307/560, 570, 571, 584, 358, 354, 630, 246

[56] References Cited

U.S. PATENT DOCUMENTS

| | | | |
|---|---|---|---|
| 3,431,467 | 11/1966 | Calfee | 307/630 |
| 4,149,098 | 4/1979 | Wright | 307/315 |
| 4,543,494 | 9/1985 | Wakimoto | 307/548 |
| 4,549,095 | 10/1985 | Stefani et al. | 307/315 |
| 4,789,796 | 12/1988 | Foss | 307/548 |
| 4,808,839 | 2/1989 | Dunn et al. | 307/544 |
| 4,885,486 | 12/1989 | Shekhawat et al. | 307/315 |
| 4,886,985 | 12/1989 | Flohrs et al. | 307/315 |
| 5,045,724 | 9/1991 | Ovens et al. | 307/544 |
| 5,144,172 | 9/1992 | Palara et al. | 307/544 |

*Primary Examiner*—William L. Sikes
*Assistant Examiner*—Shawn Riley
*Attorney, Agent, or Firm*—Thomas G. Eschweiler; Robby T. Holland; Richard Donaldson

[57] ABSTRACT

An output circuit (15) includes an output transistor (16) driving a load (18) a phase 1 turn-off circuit (32), and a phase 2 turn-off circuit (34). A status circuit (28) is connected to both the phase 1 turn-off circuit (32) and the phase 2 turn-off circuit (34). Phase 1 turn-off circuit (32) and phase 2 turn-off circuit (34) provide a two phase turn-off when status circuit (28) identifies that output transistor (16) should be turned off which allows output transistor (16) to dissipate the energy stored in any inductance without output transistor (16) entering breakdown, therefore improving the circuit's (15) reliability and reducing both the energy and the increase of current in the output transistor (16).

13 Claims, 4 Drawing Sheets

CONTROLLED POWER MOSFET SWITCH-OFF CIRCUIT

FIELD OF THE INVENTION

This invention is in the field of integrated circuits, and is directed to output power drive transistors.

CROSS-REFERENCE TO RELATED APPLICATION

The following coassigned patent application is hereby cross-referenced:

| Serial No. | Filing Date | TI Case No. |
|---|---|---|
| 07/951,712 | 09/25/92 | TI-17296 |

BACKGROUND OF THE INVENTION

Many applications of power integrated circuits require high side driver configurations such as the one illustrated in prior art circuit 10 of FIG. 1. A power MOSFET 16 has a source coupled to load 18 and a drain coupled to Vcc through inductance 12 and resistance 14 due to cabling. Output power transistors such as transistor 16 in FIG. 1 are often used in automotive applications where a power supply, Vcc, may be connected with an appreciable amount of cabling causing a cable inductance 12 and cable resistance 14. Cable inductance 12 often causes problems when, due to a short circuit across load 18, transistor 16 must be turned off quickly. A fast turn-off of power transistor 16 gives rise to a large inductive flyback since current cannot change instantaneously through an inductor which is well understood by those skilled in the art.

FIG. 1 illustrates a common prior art solution to this problem. A short circuit detect 28 monitors load 18. In the event that load 18 becomes short circuited, as, for example, an automechanic in repairing a vehicle may short load 18 with a screwdriver, short circuit detect 28 manipulates a switch 20 to discharge the voltage on the gate of transistor 16 thus turning transistor 16 off. This "fast turn-off" triggers an inductive flyback at the drain terminal of power MOSFET 16, therefore the drain terminal voltage will decrease to a large negative value very quickly when power MOSFET 16 turns off. When the inductive flyback voltage reaches the breakdown voltage of power MOSFET 16, MOSFET 16 begins to conduct in the reverse biased avalanche mode and will dissipate all the energy that was stored in inductance 12 during the conduction cycle.

The circuit of FIG. 1 has a serious drawback; namely a reliability issue. When 15 power MOSFET 16 turns off and experiences inductive flyback, it breaks down. When breakdown occurs the transistor junction breaks down nonuniformly causing "hot spots" to appear at junctions in MOSFET 16 where current has concentrated in localized areas. High current concentrations in localized areas lead to transistor damage and reliability problems.

As power integrated circuits switch larger currents and dissipate larger amounts of energy, better methods must be developed to provide switching reliability at a competitive cost.

It, accordingly, is an object of this invention to provide a circuit and method of dissipating the stored energy in inductances during switching that will protect the output device, conserve die area, and provide circuit reliability. Other objects and advantages of the invention will be apparent to those of ordinary skill in the art having reference to the following specification and drawings.

SUMMARY OF THE INVENTION

A controlled power MOSFET circuit includes a power transistor driving a load, a phase 1 turn-off circuit, and a phase 2 turn-off circuit. A status circuit is connected to both phase 1 turn-off circuit and phase 2 turn-off circuit. Phase 1 turn-off circuit and phase 2 turn-off circuit provide a two phase soft turn-off of the power transistor. The status circuit identifies a condition, such as a short circuit, wherein the output power transistor should be turned off. The status circuit then controls the phase 1 and phase 2 turn-off circuits such that the power transistor dissipates the energy stored in any inductance without entering breakdown, therefore improving the circuit's reliability.

DETAILED DESCRIPTION OF THE PREFERRED EMBODIMENT

Figure 2:
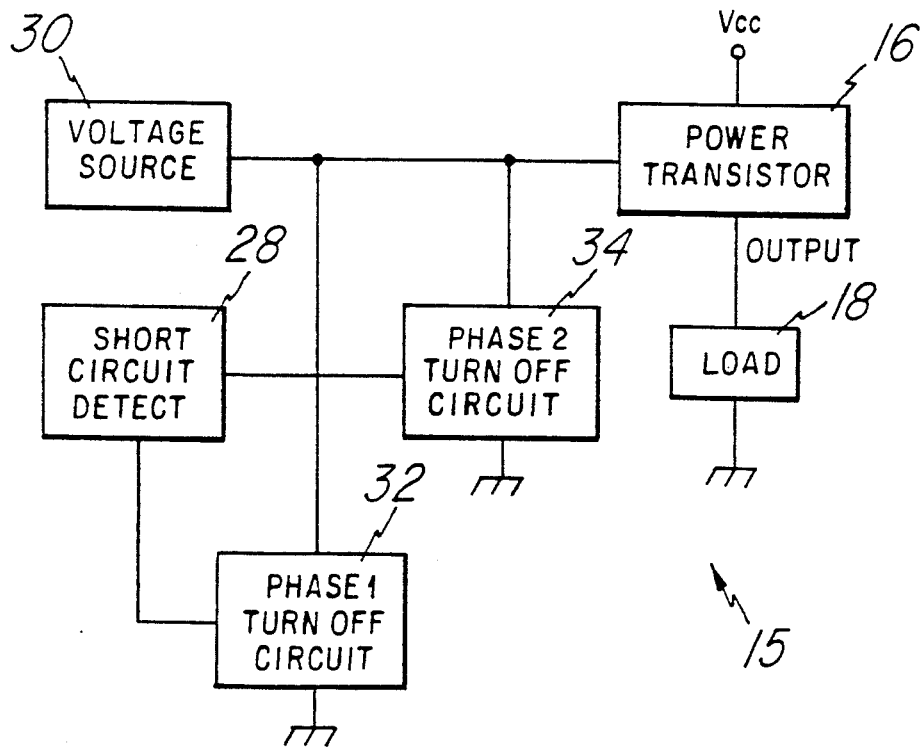
FIG.2 is a block diagram illustrating a preferred embodiment of a two phase controlled power MOSFET switch-off circuit.

FIG.2 is a block diagram illustrating an output circuit 15. Power transistor 16 is connected to a power supply, Vcc, a load 18, a phase 1 turn-off circuit 32, a phase 2 turn-off circuit 34, and a voltage source 30. Various voltage sources may work as voltage source 30 (such as a charge pump), however, voltage source 30 must be substantially greater than power supply Vcc for reasons that will be explained later.

A short circuit detect 28 is connected to both phase 1 turn-off circuit 32 and phase 2 turn-off circuit 34 and monitors the load status. When a short circuit condition is detected on load 18, short circuit detect 28 activates phase 1 turn-off circuit 32. Phase 1 turn-off circuit 32 quickly decreases the control voltage at transistor 16 until the control voltage reaches the approximate value of power supply Vcc. At that time, short circuit detect 28 deactivates phase 1 turn-off circuit 32 and activates phase 2 turn-off circuit 34. Phase 2 turn-off circuit 34 slowly decreases the control voltage of transistor 16 such that the remaining turn-off of transistor 16 is slow creating a "soft" turn-off of transistor 16. The "soft" turn-off of transistor 16 reduces the inductive flyback of inductance that exists in the cabling connecting transistor 16 and power supply to a safe value, Vcc (not shown) or when driving an inductive load. The reduction of the inductive flyback eliminates transistor breakdown, thus greatly improving circuit reliability. It is thus seen that short circuit detect 28 acts as a status circuit.

Figure 3:
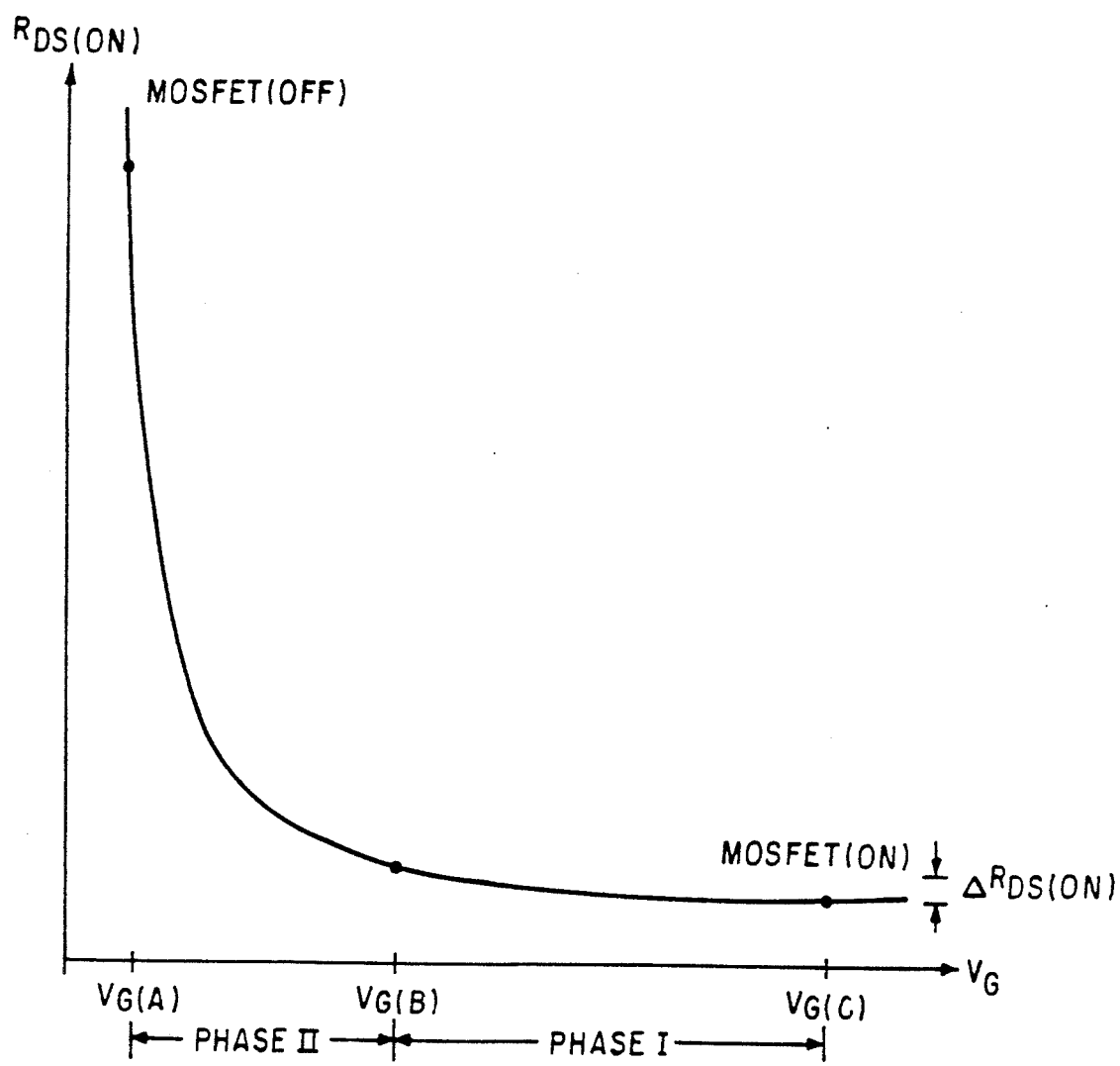
FIG.3 is a graphical diagram illustrating the relationship the between gate voltage of a MOSFET and Rds(on).

FIG. 3 is a graphical diagram illustrating the relationship between the gate voltage ($V_G$) and Rds(on) of a MOSFET. The Rds(on) of the MOSFET is the effective resistance exhibited by the MOSFET at any point in time. When MOSFET is not conducting (or OFF), the Rds(on) is ideally infinite and when conducting (or ON), Rds(on) is ideally zero. It can be seen from FIG. 3 that the relationship between $V_G$ and Rds(on) is a continuous function, therefore at certain values of $V_G$, the MOSFET may conduct partially.

Figure 4:
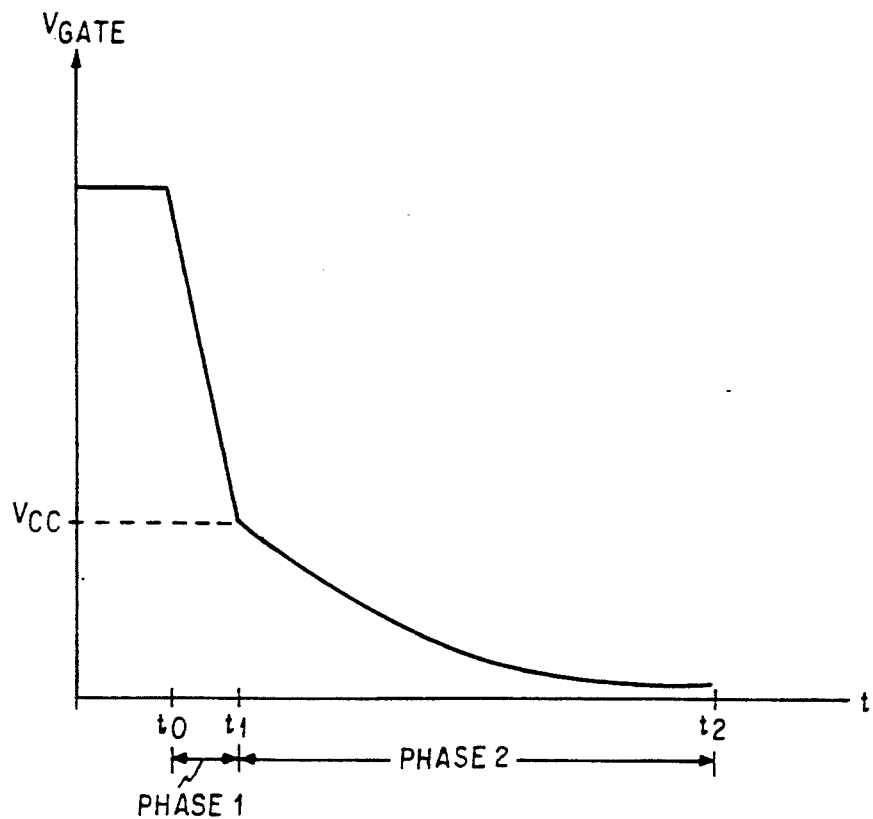
FIG.4 is a graphical diagram illustrating the gate voltage of a MOSFET with respect to time during MOSFET turn-off.

FIG. 4 is a graph illustrating the relationship of the gate voltage of a MOSFET with respect to time. Assuming power transistor 16 of FIG. 2 is a power MOSFET as an example, when short circuit detect 28 detects a short circuit across load 18 at time $t=t_0$, it communicates this status to phase 1 turn-off circuit 32 which quickly decreases the gate voltage down to approximately the power supply voltage, Vcc, at time $t=t_1$. At this time, phase 1 turn-off circuit 32 deactivates and phase 2 turn-off circuit 34 becomes activated which slowly decreases the gate voltage from $t=t_1$ to $t=t_2$. Note that $t_2-t_1>>t_1-t_0$.

Figure 5:
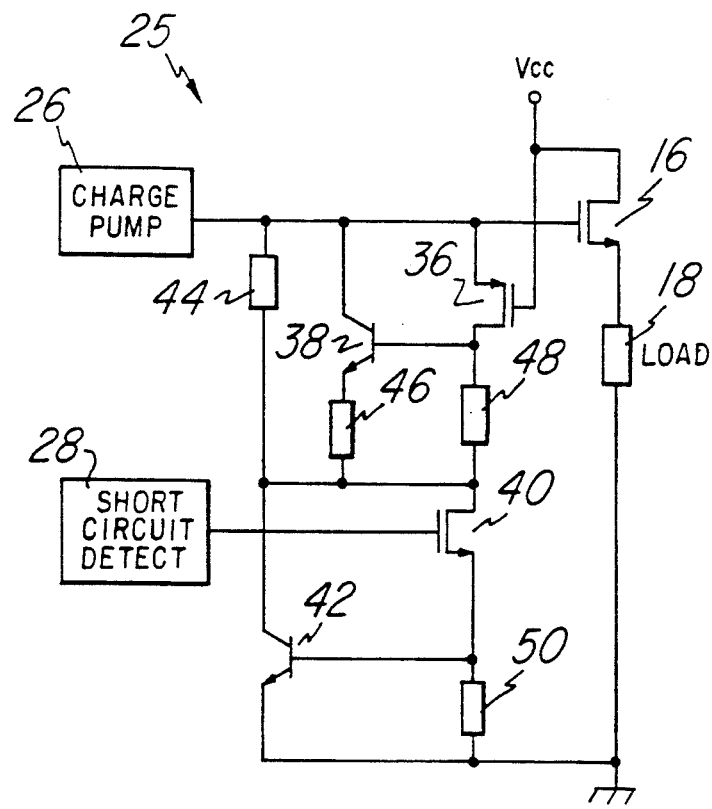
FIG.5 is a circuit diagram illustrating a preferred circuit embodiment of the invention shown in the block diagram of FIG.2.

FIG. 5 is a circuit 25 illustrating a potential implementation of embodiment 15 illustrated in FIG. 2. In FIG. 5, a power MOSFET 16 has a drain connected to power supply Vcc and a source connected to load 18 which in turn is connected to circuit ground. A gate of MOSFET 16 is connected to a charge pump circuit 26 which provides a gate voltage greater than power supply voltage Vcc so that power MOSFET can be turned on ($V_G$ must be greater than Vcc by at least the threshold voltage of MOSFET 16). A PMOS transistor 36 has a source connected to the gate of MOSFET 16, a gate connected to Vcc, and a drain connected to a resistance 48. Resistance 48 may be a standard resistor or an active component biased appropriately to provide a given resistance. Other methods of providing effective resistances may also be employed to provide resistance 48. A bipolar transistor 38 has a collector connected to the gate of power MOSFET 16, a base connected to the drain of PMOS transistor 36, and an emitter connected to a resistance 46. Both resistance 48 and resistance 46 are connected to a drain of an NMOS transistor 40. NMOS transistor 40 has a gate connected to short circuit detect 28 which monitors load 18 and communicates the status of load 18 to NMOS transistor 40. NMOS transistor 40 also has a source connected to a resistance 50 which in turn is connected to circuit ground. A resistance 44 is connected between the gate of power MOSFET 16 and the drain of NMOS transistor 40. A bipolar transistor 42 has a collector connected to the drain of NMOS transistor 40, a base connected to the source of NMOS transistor 40, and an emitter connected to circuit ground.

The following is a functional description of how the circuit of FIG. 5 operates. 15 In phase 0 (before $t=t_0$), the gate of power MOSFET 16 is held at a voltage significantly greater than Vcc by charge pump 26 and is conducting. Since the gate of PMOS transistor 36 is connected to Vcc and the source of PMOS transistor 36 is connected to charge pump 26 which is significantly greater than Vcc, PMOS transistor 36 is on, but conducts no current due to other circuit components being biased off. (Technically it is understood that a transistor is "on" only when conducting current. However, in this application a transistor will be considered "on" any time its gate or base-emitter terminal is biased such that current could conduct through the transistor if surrounding components permitted current flow.) PMOS transistor 36 will remain on as long as the following condition exists:

$$V_{gate(M16)} > Vcc + V_{t(M36)}$$

Figure 1:
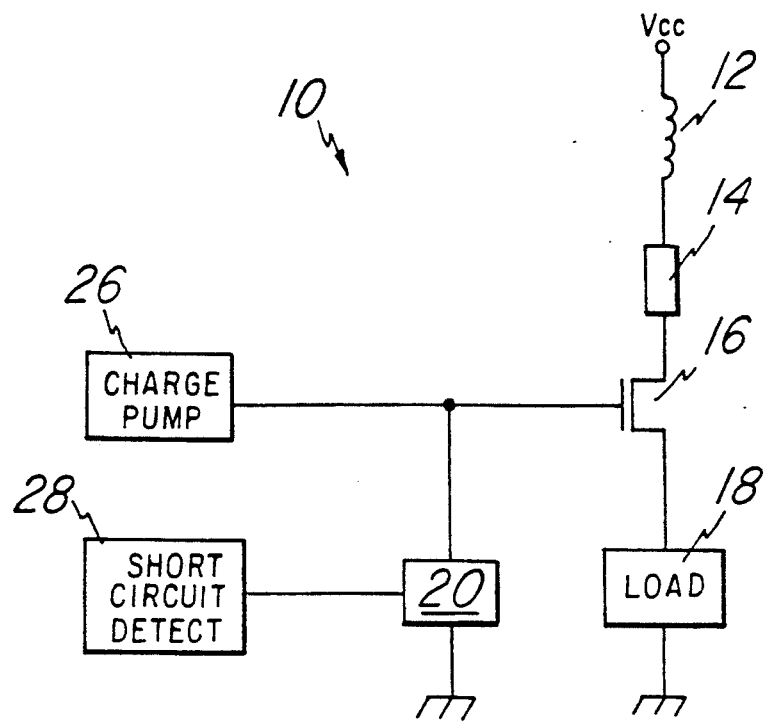
FIG. 1 is a circuit diagram illustrating a prior art output circuit.

Because no current is conducting, the voltage drop across resistance 48 is zero. This mandates that bipolar transistor 38 be off since the $V_{be}$ of transistor 38 must be approximately greater than 0.6 V for it to conduct. Since the combined voltage drop across PMOS transistor 36 and resistance 48 is zero, no current conducts through resistance 44. PMOS transistor 36 does not conduct because during phase 0 no shorted load is detected. Therefore, short circuit detect 28 has a low logic value at the gate of NMOS transistor 40 which also mandates that bipolar transistor 42 is off because no voltage drop exists across resistance 50. In phase 1 ($t_0<t<t_1$), short circuit detect 28 detects a short circuit condition across load 18 and it is activated by its output transitioning from a low logic level to a high logic level. The high logic level on the output of short circuit detect 28 turns on NMOS transistor 40. Since PMOS transistor 36 is still on it conducts current through resistance 48, NMOS transistor 40, and resistance 50 to circuit ground. As a voltage develops across resistance 48 it turns on bipolar transistor 38 which multiplies the current supplied by PMOS transistor 36, effectively providing additional gain and therefore lower resistance. Additionally, as current flows through resistance 50 a voltage develops across it and turns on bipolar transistor 42. Bipolar transistor 42 acts as a pseudo-darlington configuration with NMOS transistor 40 which provides a lower effective resistance in the lower tier of the circuit. Therefore during phase 1, the gate of power transistor 16 is discharging at a rate determined by the time constant:

$$RC(phase\ 1) = R_{eff1} * C_{gate}$$

where $$R_{eff1} = R(on)_{38} + R_{46} + R(on)_{42}$$

and $R(on)_{38}$ and $R(on)_{42}$ are the "on" resistances of transistors 38 and 42, and $C_{gate}$ is the gate capacitance of power MOSFET 16. It should be noted that $R_{eff1}$ is actually the effective resistance of resistances 44, 46, 48, and 50 and transistors 36, 38, 40, and 42 connected in series and parallel respectively according to FIG. 5. However, an accurate approximation of the complicated effective resistance is $R(on)_{38}+R_{46}+R(on)_{42}$. Since $R_{eff1}$ needs to be as small as possible it is desirable for $R_{46}$ to be a small value. During phase 1 the voltage at the gate of MOSFET 16 is dropping at the rate dictated by RC(phase 1). The components conducting during this time: PMOS transistor 36, bipolar transistor 38, NMOS transistor 40, bipolar transistor 42, and resistances 46, 48, and 50 comprise phase 1 turn-off circuit 32 of FIG. 1.

Phase 2 ($t_1<t<t_2$) occurs when the following condition takes place:

$$V_{gate(M16)} = V_{cc} + V_{136}$$

At this time PMOS transistor 36 turns off thus robbing bipolar transistor 38 of its base drive, thus bipolar transistor 38 turns off. Short circuit detect 28 still detects a short circuit across load 18, therefore NMOS transistor 40 is still turned on. Therefore, the conduction path for phase 2 of FIGS. 3 and 4 is through resistance 44. Since it is desirable for the discharging of the gate of power MOSFET 16 to proceed slowly during phase 2, resistance 44 is chosen to be fairly large. The effective RC time constant in phase 2 is given by:

$$RC(phase\ 2) = R_{eff2} * C_{gate}$$

where $$R_{eff2} \approx R_{44} + R(on)_{42}.$$

Since $$R_{44} > > R(on)_{42},\ R_{eff2} \approx R_{44}.$$

Therefore, $$RC(phase\ 2) \approx R_{44} * C_{gate}.$$

Again, it should be noted that $R_{eff2}$ is actually the effective resistance of resistances 44 and 50 and transistors 40 and 42 connected in series and parallel respectively according to FIG. 5. However, an accurate approximation of the complicated effective resistance is $R_{44} + R(on)_{42}$. It is therefore easily seen how circuit 25 discharges the gate voltage of power MOSFET 16 in two distinct phases and at two distinct rates thereby satisfying the conditions illustrated in FIGS. 3 and 4.

Figure 6:
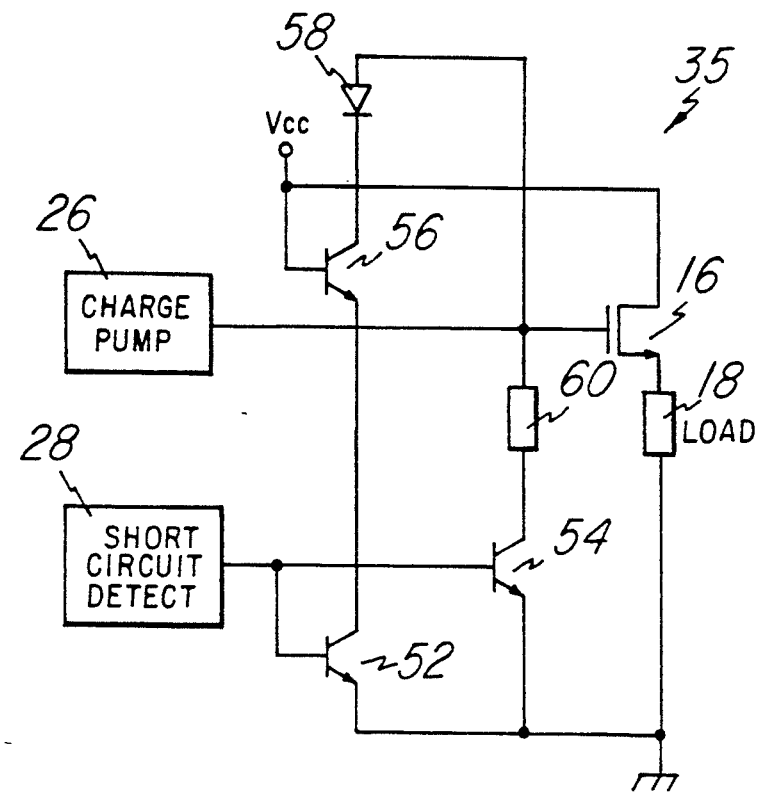
FIG.6 is a circuit diagram illustrating an alternative embodiment of the invention.

FIG. 6 is a circuit 35 illustrating a second potential implementation of embodiment 15 illustrated in FIG. 2. In FIG. 6, power MOSFET 16 is connected to load 18, charge pump 26, and to power supply, Vcc, as in FIG. 5. A resistance 60 is connected to the gate of power MOSFET 16. A bipolar transistor 54 has a collector connected to resistance 60, a base connected to short circuit detect 28, and an emitter connected to circuit ground. A diode 58 has an anode connected to the gate of power MOSFET 16 and a cathode connected to a collector of a bipolar transistor 56. Bipolar transistor 56 has a base connected to power supply, Vcc, and an emitter connected to a bipolar transistor 52 which has a base connected to short circuit detect 28 and an emitter connected to circuit ground.

The following is a functional description of how circuit 35 operates. In phase 0 (before $t=t_0$), power MOSFET 16 is being driven by charge pump 26 and is conducting. Since the voltage of charge pump 26 is greater than Vcc, diode 58 is forward biased. However, since the signal from short circuit detect 28 is at a low logic level transistors 52 and 54 are off. Therefore transistor 56 is off and diode 58 conducts no current. In phase 1 ($t_0 < t < t_1$), short circuit detect 28 senses a short circuit across load 18 causing its output signal to transition from a low logic level to a high logic level, thus turning on transistors 52 and 54. During phase 1 the charge on the gate of power MOSFET 16 discharges through two parallel paths: through resistance 60 and transistor 54 to circuit ground, and through diode 58, transistor 56 and transistor 52 to circuit ground. However, in circuit 35, since transistors 52, 54 and 56 do not remain in saturation throughout the short circuit condition, an RC time constant discussion is not accurate. In phase 1, transistor 52 behaves like a current source pulling a current $I_{c(52)}$. The current through resistance 60 $I_{R(60)}$ is much smaller since resistance 60 is a fairly large resistance (the reason will be explained later). Thus $I_{c(52)} > > I_{R(60)}$. Since $I_{c(52)} > > I_{R(60)}$ the following approximation can be used to calculate the discharge time $(t_1 - t_0)$ during phase 1.

$$I = C * dV/dT$$

thus, $$I_{c(52)} = C_{gate} * \Delta V_{gs(16)} / \Delta t.$$

Rearranging and integrating gives:

$$t_1 - t_0 = \{C_{gate}/I_{c(52)}\} * \{V_{gs(16)} - V_{cc}\}.$$

Since $C_{gate}/I_{c(52)}$ is a small number the discharge time during phase 1 $(t_1 - t_0)$ is very fast as shown in FIG. 4. As the gate of power MOSFET 16 discharges the gate voltage is decreasing. When the gate voltage decreases to approximately Vcc+V(diode) circuit 35 reaches phase 2 $(t_1 < t < t_2)$ and diode 58 stops conducting which thereby eliminates one of the paths for the discharge of the gate. Therefore, during phase 2 the gate discharges through the path of resistance 60 and bipolar transistor 54 to circuit ground. Since the rate of discharge is desired to be slow during phase 2, $R_{60}$ is chosen to be quite large. Therefore during phase 2 the current flowing through resistance 60 is $I_{R(60)}$ which is fairly small. Using the same concept as in phase 1 a discharge time may be calculated for phase 2.

$$I = C * dV/dT$$

thus, $$I_{R(60)} = C_{gate} * \Delta V_{gs(16)} / \Delta t.$$

Rearranging and integrating gives:

$$t_2 - t_1 = \{C_{gate}/I_{R(60)}\} * \{\ln V_{cc} - \ln V_{t(16)}\}$$

which can be simplified to $$t_2 - t_1 = \{C_{gate}/I_{R(60)}\} * \ln V_{cc}/V_{t(16)}).$$

It is obvious by looking at the discharge times during phase 1 and phase 2 that the discharge time during phase 2 is much longer than phase 1 since $$C_{gate}/I_{R(60)} > > C_{gate}/I_{c(52)}.$$

Therefore in FIG. 6 it is seen how circuit 35 breaks the turn-off of power transistor 16 into two distinct phases with two distinct turn-off rates; phase 1 which is a quick turn-off and phase 2 which is a slow turn-off.

Figure 7:
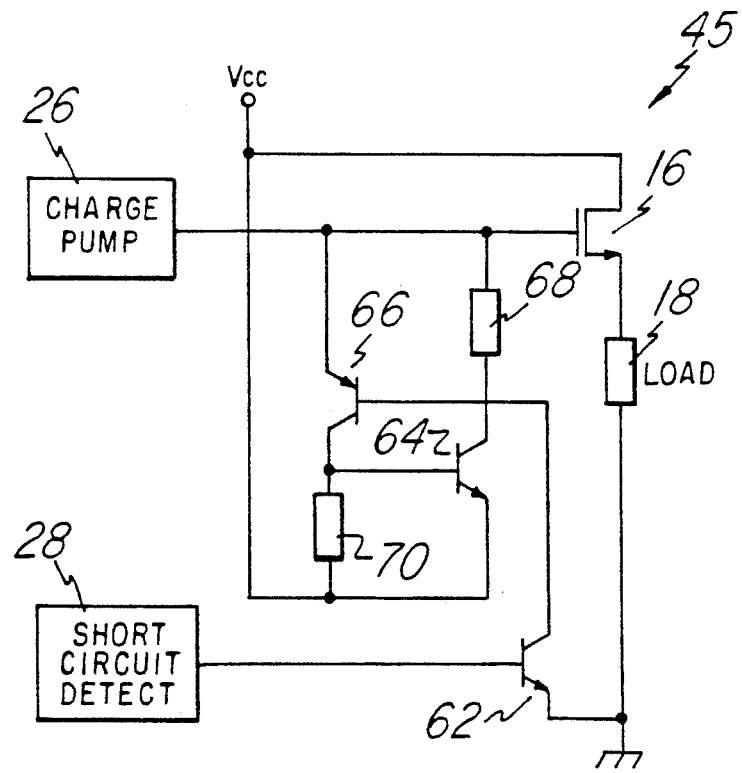
FIG.7 is a circuit diagram illustrating another alternative embodiment of the invention.

FIG. 7 is a circuit 45 illustrating a third potential implementation of embodiment 15 illustrated in FIG. 2. In FIG. 7, power MOSFET 16 is connected to load 18, power supply, Vcc, and charge pump 26 as in FIG. 5. Additionally, a resistance 68 is connected to the gate of power MOSFET 16. An NPN bipolar transistor 64 has a collector connected to the resistance 68 and an emitter connected to power supply, Vcc. A PNP bipolar transistor 66 has an emitter connected to the gate of power MOSFET 16, a base connected to the collector of bipolar transistor 64, and a collector connected to a resistance 70 which in turn is connected to power supply, Vcc. A bipolar transistor 62 has a collector connected to the collector of bipolar transistor 64, a base connected to short circuit detect 28, and an emitter connected to circuit ground.

The following is a functional description of how the circuit of FIG. 7 operates. In phase 0 (before t=t₀), power MOSFET 16 is being driven by charge pump 26 and is conducting. Since no short is detected across load 18 at this time, short circuit detect 28 outputs a low logic voltage value such that bipolar transistor 62 is off. Since there is no available current sink (transistor 62 is biased off) the SCR formed by bipolar transistors 64 and 66 cannot be triggered. When short circuit detect 28 senses a short circuit across load 18 its output transitions from a low logic value to a high logic value which turns on transistor 62. When transistor turns on it triggers the SCR in the following way. When transistor 62 turns on, it draws current through resistance 68 which begins developing a voltage across it. Once the voltage across resistance 68 increases approximately above 0.6 V transistor 66 gets turned on. Therefore transistor 62 is drawing current from resistance 68 and the base of transistor 66. When transistor 66 turns on current flows through resistance 70 which then develops a voltage across it. When the voltage across resistance 70 increase approximately above 0.6V transistor 64 turns on. When transistor 64 turns on it draws more base current from transistor 66 which drives transistor 66 harder. As transistor 66 drives more current it supplies more base current to transistor 64 causing transistor 64 to be driven harder. The two transistors 64 and 66 have a cumulative "snowball" effect on one another causing both to drive each other harder. In this way transistor 62 "triggers" the SCR formed by transistors 64 and 66. While the SCR is triggered the gate voltage is discharged rapidly through the SCR. The RC time constant during phase 1 is as follows:

$$RC(\text{phase 1}) = R_{\text{eff1}} \cdot C_{\text{gate}}$$

where $$R_{\text{eff1}} = R_{SCR}.$$

where $R_{SCR}$ represents the resistance of the SCR when it has been triggered. Therefore $$RC(\text{phase 1}) \approx R_{SCR} \cdot C_{gate}.$$

When the gate voltage reaches the approximate value of Vcc the SCR loses the needed hold current to remain conducting and the SCR turns off. This ends phase 1. In phase 2 (t₁<t<t₂) transistor 62 is still on and the only discharge path left is through resistance 68 and transistor 62 to circuit ground. Since it is desired for the rate of discharge during phase 2 to be slow, R₆₈ is made a large value. Therefore the RC time constant during phase 2 is as follows:

$$RC(\text{phase 2}) = R_{\text{eff2}} \cdot C_{gate}$$

where $$R_{\text{eff2}} = R_{68} + R(on)_{62}$$

and $$(i \cdot R_{68}) < V_{be(66)}.$$

Since $$R_{68} << R(on)_{62},$$

then $$R_{\text{eff2}} \approx R_{68}$$

and $$RC(\text{phase 2}) \approx R_{68} \cdot C_{gate}.$$

Therefore in FIG. 7 it is easily seen how circuit 45 breaks the turn-off of power transistor 16 into two distinct phases having two distinct turn-off rates: phase 1 which is a quick turn-off and phase 2 which is a slow turn-off.

Although the invention has been described with reference to the embodiments herein, this description is not to be construed in a limiting sense. Various modifications of the disclosed embodiments will become apparent to persons skilled in the art upon reference to the description of the invention. It is therefore contemplated that the appended claims will cover any such modifications or embodiments as fall within the true scope of the invention.

What is claimed is:

1. An output circuit, comprising:
   an output transistor;
   a phase 1 turn-off circuit connected to the output transistor, wherein the phase 1 turn-off circuit has a low effective resistance;
   a phase 2 turn-off circuit connected to the output transistor, wherein the phase 2 turn-off circuit has a high effective resistance; and
   a status circuit connected to the phase 1 turn-off circuit and the phase 2 turn-off circuit operable to monitor a status signal and activate the phase 1 turn-off circuit and the phase 2 turn-off circuit consecutively to turn off the output transistor in two distinct phases in response to a transition of the status signal, wherein the low effective resistance of the phase 1 turn-off circuit causes the rate of turn-off of the output transistor to be rapid during a first phase and the high effective resistance of the phase 2 turn-off circuit causes the rate of turn-off of the output transistor to be slow during a second phase.

2. The circuit of claim 1 wherein the output transistor comprises a power MOSFET.

3. The circuit of claim 2 wherein a gate terminal of power MOSFET is consecutively controlled by the phase 1 turn-off circuit and by the phase 2 turn-off circuit whereby the power MOSFET has a controlled turn off rate.

4. The circuit of claim 1 wherein the phase 1 turn-off circuit comprises:
   a first pseudo-darlington circuit connected to the output transistor; and
   a second pseudo-darlington circuit connected in series with the first pseudo-darlington circuit, whereby, during conduction, the first and second pseudo-darlington circuits connected in series provide an effective low resistance path between a control terminal of the output transistor and circuit ground to quickly initiate output transistor turn-off.

5. The circuit of claim 1 wherein the phase 1 turn-off circuit comprises an SCR which is triggered by the status circuit, whereby the SCR provides an effective low resistance to quickly initiate output transistor turn-off.

6. The circuit of claim 5 wherein the SCR further comprises:
   a PNP transistor having a collector, a base and an emitter; and
   an NPN transistor having a collector, a base and an emitter, the collector of the NPN transistor connected to the base of the PNP transistor and a base of the NPN transistor connected to the collector of the PNP transistor.

7. The circuit of claim 1 wherein the phase 1 turn-off circuit comprises a forward biased diode connected in series with at least one conducting transistor connected between a control terminal of the output transistor and circuit ground to quickly initiate output transistor turn-off.

8. The circuit of claim 1 wherein the phase 2 turn-off circuit comprises a resistance connected in series with a conducting transistor wherein the resistance is large enough to cause the turn-off time of output transistor during phase 2 to be substantially smaller than the turn-off time of phase 1 turn-off circuit.

9. A method of eliminating voltage transients when turning off an output transistor, comprising the steps of:
   activating a phase 1 turn-off circuit, wherein the phase 1 turn-off circuit causes the rate of turn-off of the output transistor to be rapid;
   deactivating the phase 1 turn-off circuit; and
   activating a phase 2 turn-off circuit until the output transistor is completely turned off, wherein the phase 2 turn-off circuit causes the rate of turn-off of the output transistor to be slow.

10. The method of claim 9 wherein activating the phase 1 turn-off circuit comprises the steps of:
    identifying a status signal transition that communicates a desire for the output transistor to be turned off;
    transitioning a control signal in response to the status signal transition; and
    activating a low resistance path between a control terminal of the output transistor and circuit ground whereby the output transistor initiates its turn-off.

11. The method of claim 9 wherein deactivating the phase 1 turn-off circuit comprises the steps of:
    monitoring a voltage value at a control terminal of the output transistor; and
    deactivating a low resistance path after the voltage value reaches a predetermined value.

12. The method of claim 9 wherein activating the phase 2 turn-off circuit comprises the steps of:
    identifying that the phase 1 turn-off circuit has been deactivated; and
    activating a resistance path between the control terminal of the output transistor and circuit ground, the resistance path being large enough to provide a slower rate of turn-off than provided by phase 1 turn-off circuit.

13. A method of switching an inductive load, comprising the steps of:
    discharging a control terminal of a transistor driving the inductive load at a first rate through a first discharge path having a first resistance, causing the inductive load to switch at a speed dictated by the first rate of discharge;
    discontinuing the discharge of the control terminal of the transistor at the first rate; and
    discharging the control terminal of the transistor at a second rate through a second discharge path having a second resistance, the second resistance being greater than the first resistance thereby causing the inductive load to switch at a speed dictated by the second rate of discharge, wherein the second rate of discharge is slower than the first rate of discharge.

* * * * *